US008716816B2

(12) United States Patent
Fitzpatrick (10) Patent No.: US 8,716,816 B2
(45) Date of Patent: May 6, 2014

(54) SOI-BASED CMUT DEVICE WITH BURIED ELECTRODES

(75) Inventor: Glen A Fitzpatrick, Edmonton (CA)

(73) Assignee: Micralyne Inc., Edmonton, Alberta (CA)

( * ) Notice: Subject to any disclaimer, the term of this patent is extended or adjusted under 35 U.S.C. 154(b) by 115 days.

(21) Appl. No.: 13/272,054

(22) Filed: Oct. 12, 2011

(65) Prior Publication Data

US 2012/0086087 A1   Apr. 12, 2012

Related U.S. Application Data

(60) Provisional application No. 61/392,432, filed on Oct. 12, 2010.

(51) Int. Cl.
H01L 29/84 (2006.01)
(52) U.S. Cl.
USPC .................................. 257/415; 257/E29.324
(58) Field of Classification Search
None
See application file for complete search history.

(56) References Cited

U.S. PATENT DOCUMENTS

| | | | |
|---|---|---|---|
| 6,426,582 B1 * | 7/2002 | Niederer et al. | 310/309 |
| 7,745,248 B2 | 6/2010 | Park et al. | |
| 7,846,102 B2 | 12/2010 | Kupnik et al. | |
| 8,324,006 B1 | 12/2012 | Adler et al. | |
| 2004/0085858 A1 * | 5/2004 | Khuri-Yakub et al. | 367/181 |
| 2008/0290756 A1 | 11/2008 | Huang | |
| 2008/0315331 A1 | 12/2008 | Wodnicki et al. | |
| 2009/0152705 A1 * | 6/2009 | Breng et al. | 257/690 |
| 2010/0327380 A1 | 12/2010 | Chang | |

FOREIGN PATENT DOCUMENTS

WO        2005084284        9/2005

OTHER PUBLICATIONS

Kupnik et al.; CMUT Fabrication Based on a Thick Buried Oxide Layer; IEEE International Ultrasonics Symposium, San Diego, CA, Oct. 13, 2010, downloaded from http://www-kyg.stanford.edu/khuriyakub/opencms/Downloads/10_Kupnik_01.pdf.
Tsuji et al.; Low Temperature Process for CMUT Fabrication With Wafer Bonding Technique; IEEE International Ultrasonics Symposium, San Diego, CA, Oct. 13, 2010.
Zhuang et al.; Wafer-Bonded 2-D CMUT Arrays Incorporating Through-Wafer Trench-Isolated Interconnects With a Supporting Frame; IEEE Transactions on Ultrasonics Ferroelectrics and Frequency Control, vol. 56, No. 1, Jan. 2009; p. 182-192.
Zhang et al.; CMUTs With Improved Electrical Safety and Minimal Dielectric Surface Charging; IEEE International Ultrasonics Symposium, San Diego, CA, Oct. 13, 2010, P3-T1-5.

* cited by examiner

*Primary Examiner* — Michael Lebentritt
*Assistant Examiner* — Kevin Quinto
(74) *Attorney, Agent, or Firm* — Anthony R. Lambert

(57) ABSTRACT

A multi-layer stacked micro-electro-mechanical (MEMS) device that acts as a capacitive micromachined ultrasonic transducer (CMUT) with a hermetically sealed device cavity formed by a wafer bonding process with semiconductor and insulator layers. The CMUT design uses a doped Si SOI and wafer bonding fabrication method, and is composed of semiconductor layers, insulator layers, and metal layers. Conventional doped silicon may be used for electrode layers. Other suitable semi-conductor materials such as silicon carbide may be used for the electrode layers. The insulator may be silicon oxide, silicon nitride or other suitable dielectric.

10 Claims, 11 Drawing Sheets

SOI-BASED CMUT DEVICE WITH BURIED ELECTRODES

CROSS-REFERENCE TO RELATED APPLICATIONS

This application claims the benefit under 35 USC 119(e) of U.S. provisional application Ser. No. 61/392,432 filed Oct. 12, 2010.

TECHNICAL FIELD

Capacitive micromachined ultrasonic transducers.

BACKGROUND

Ultrasonic transducers are required in areas such as imaging, diagnostic medical and for NDT (Non Destructive Testing). There is a continuing need for smaller and more reliable ultrasonic transducers. Existing ultrasonic transducers include piezo-electric transducers.

SUMMARY

Therein is provided a bonded SOI structure using hermetically sealed buried electrodes for a capacitive micromachined ultrasonic transducer (CMUT) device. The invention comprises this unique CMUT architecture and the process for making it.

In an embodiment, there is disclosed a method of making a capacitive micromachined ultrasonic transducer (CMUT) device, the method comprising providing a wafer having at least a first semi-conductor electrode layer on an insulating dielectric, forming the first semi-conductor electrode layer into a CMUT pattern with dielectric stand-offs on the first semi-conductor electrode layer, the dielectric stand-offs being continuous in at least selected portions of the CMUT pattern to define sealed CMUT cavities, bonding a second semi-conductor electrode layer onto the dielectric stand-offs, the dielectric stand-offs having a height sufficient to provide electrical isolation between the first semi-conductor electrode layer and the second semi-conductor electrode layer; and for each CMUT in the CMUT pattern, providing respective contacts on the first semi-conductor electrode layer and the second semi-conductor electrode layer.

In various embodiments, forming the first semi-conductor electrode layer into a CMUT pattern comprises oxidizing and etching the first semi-conductor electrode layer, oxidizing the first semi-conductor electrode layer is carried out before etching of the first semi-conductor electrode, oxidizing the first semi-conductor electrode layer is carried out after etching of the first semi-conductor electrode layer, the respective contacts comprise metalized portions of the respective first semi-conductor electrode layer and the second semi-conductor electrode layer, providing the respective contact on the first semi-conductor electrode layer comprises removing a portion of the second semi-conductor electrode layer, the wafer comprises a handle layer and the method further comprising removing all or part of the handle layer, adjusting the thickness of the second semi-conductor electrode layer, adjusting the thickness of the second semi-conductor electrode layer comprises grinding or polishing or both grinding and polishing of the second semi-conductor electrode layer, growing a barrier dielectric on the CMUT pattern of the wafer prior to bonding a second semi-conductor electrode layer onto the dielectric stand-offs, the second semi-conductor electrode layer is grounded.

In a further embodiment, there is disclosed a capacitive micromachined ultrasonic transducer (CMUT) device, comprising a wafer having at least a first semi-conductor electrode layer on an insulating dielectric, the first semi-conductor electrode layer being oxidized and etched into a CMUT pattern with dielectric stand-offs on the first semi-conductor electrode layer, the dielectric stand-offs being continuous in at least selected portions of the CMUT pattern to define sealed CMUT cavities, a second semi-conductor electrode layer bonded onto the dielectric stand-offs, the dielectric stand-offs having a height sufficient to provide electrical isolation between the first semi-conductor electrode layer and the second semi-conductor electrode layer; and for each CMUT in the CMUT pattern, respective contacts on the first semi-conductor electrode layer and the second semi-conductor electrode layer.

In various embodiments of the CMUT, the respective contacts comprise metalized portions of the respective first semi-conductor electrode layer and the second semi-conductor electrode layer, a portion of the second semi-conductor electrode layer is removed to provide access to the respective contact on the first semi-conductor electrode layer, the wafer comprises a handle layer having a portion removed, a barrier dielectric is provided on the CMUT pattern of the wafer.

In various embodiments of the method or CMUT, the semi-conductor may be silicon or silicon carbide, and the dielectric may be one or more of a silicon oxide, a silicon nitride, or a silicon oxynitride.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which:

FIGS. 3A-3C.

FIGS. 6A-6R.

FIGS. 7A-7J: FIGS. 7D, 7F, 7H and 7J correspond to the section line shown in FIG. 7B and form a sequence, corresponding to the sequence of FIGS. 7C-7I, showing the same process.

FIGS. 8A-8C.

DETAILED DESCRIPTION

Figure 4A:
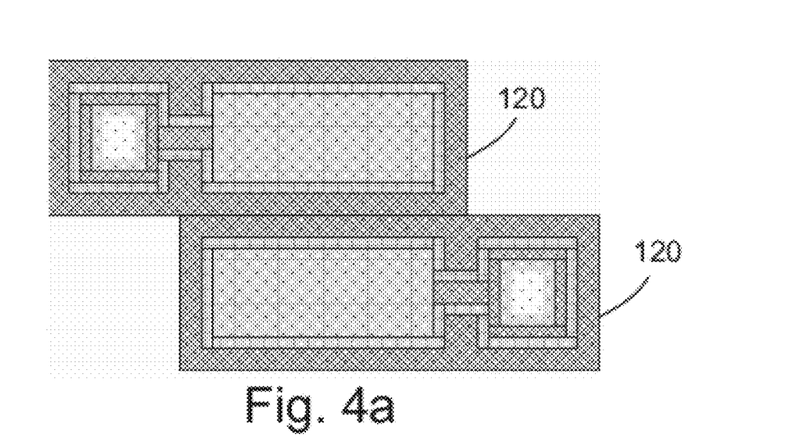
FIG. 4A: shows orientation of two CMUT cells that may be part of a one dimensional linear array of CMUT cells as shown in FIG. 4B.
Figure 4B:
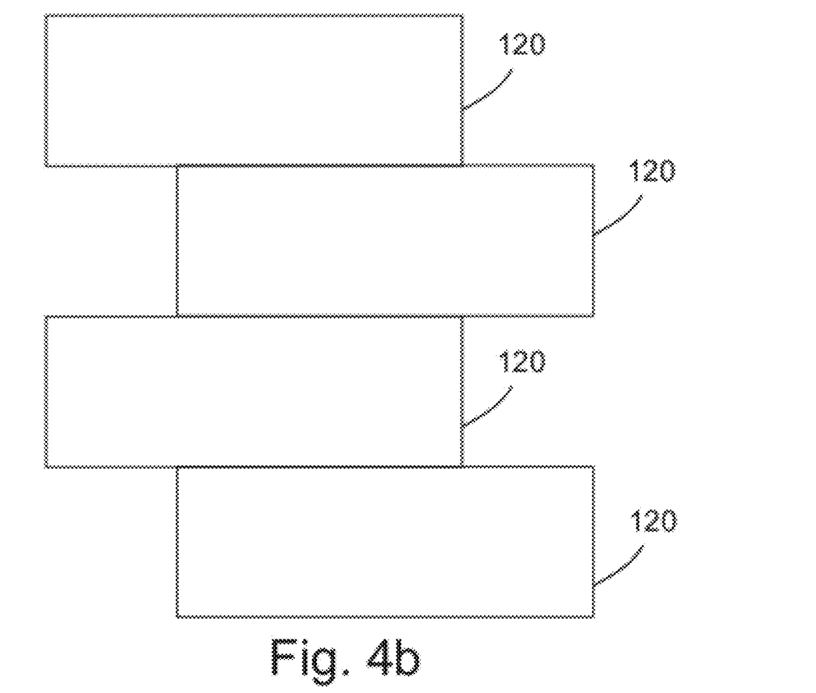
Figure 5:
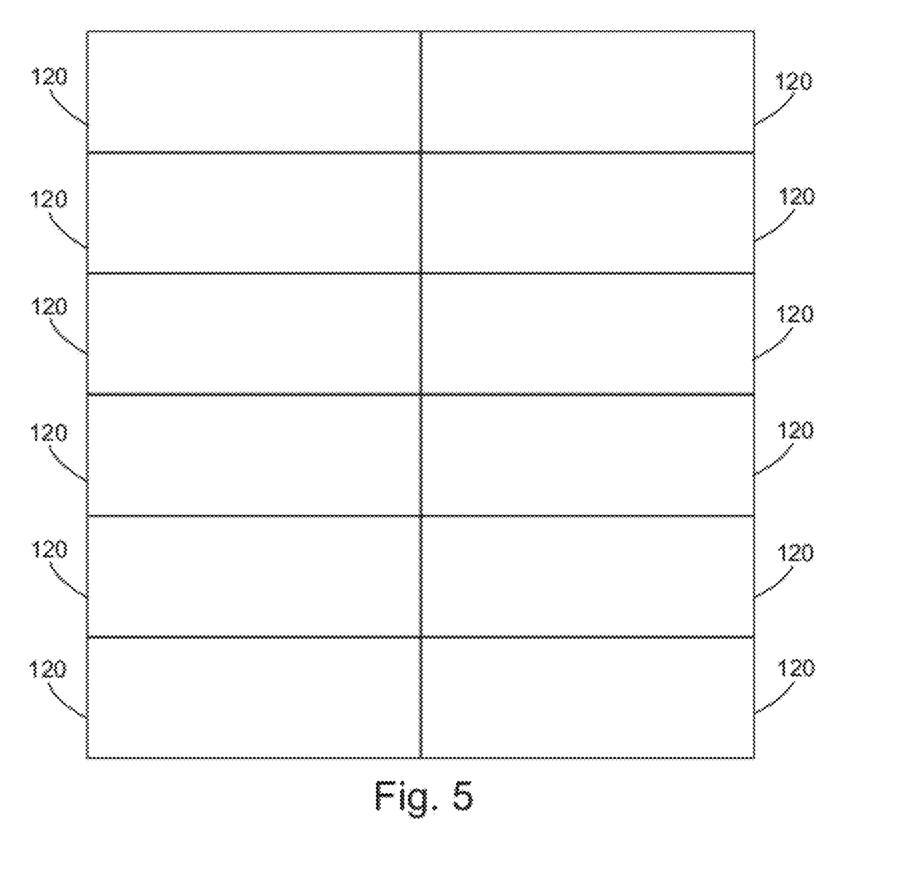
FIG. 5: A representative two dimensional array of CMUT cells where each CMUT cell may be as shown in FIG. 1D for example. It is understood that by routing the lower Si wires connecting the bond pads to the lower CMUT electrode appropriately, larger or smaller m×n arrays of CMUT cells can be formed.

The present invention relates to a multi-layer stacked micro-electro-mechanical (MEMS) device that acts as a capacitive micromachined ultrasonic transducer (CMUT) with a hermetically sealed device cavity formed by a wafer bonding process with semiconductor and insulator layers. The CMUT is indicated generally in the figures by the reference numeral 120. As shown in FIGS. 4A, 4B and 5, CMUTs 120 may be arranged in linear and two dimensional arrays.

The CMUT design uses a simple (as few as 3 mask steps and no bond alignment) doped Si SOI and wafer bonding fabrication method, and is composed of semiconductor layers, insulator layers, and metal layers. Conventional doped silicon, now known or hereafter developed, is used for electrode layers. Other suitable semi-conductor materials such as silicon carbide may be used for the electrode layers. The insulator may be silicon oxide, in the preferred embodiment, or alternatively, silicon nitride or other suitable dielectric. Suitable means suitable for use in a CMUT, so that the layers may be fabricated on the required scale and have the appropriate properties (electrically conductive or non-conductive as the case may be). FIGS. 1A to 1D show a progression of perspective views, each view showing additional layers grown, bonded or patterned. FIG. 2 shows a progression of plan views (a) to (d), each view showing additional layers grown, bonded or patterned. The term pattern refers to one or more CMUTs formed on a wafer.

Figure 3A:
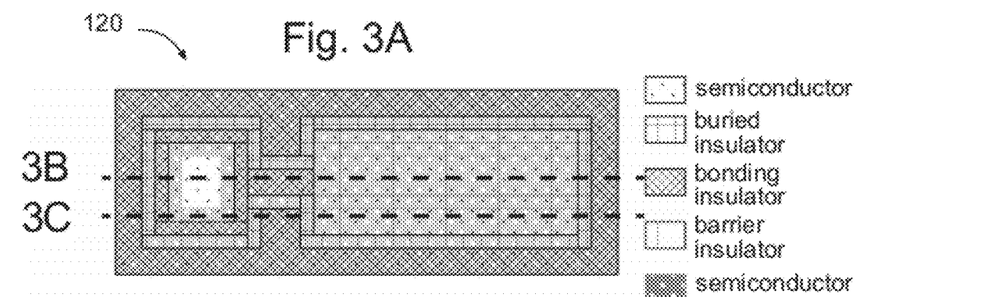
FIG. 3A shows a plan view of a representative CMUT device wherein the dashed lines depict the section lines cut along to produce views 3B and 3C.
Figure 3B:
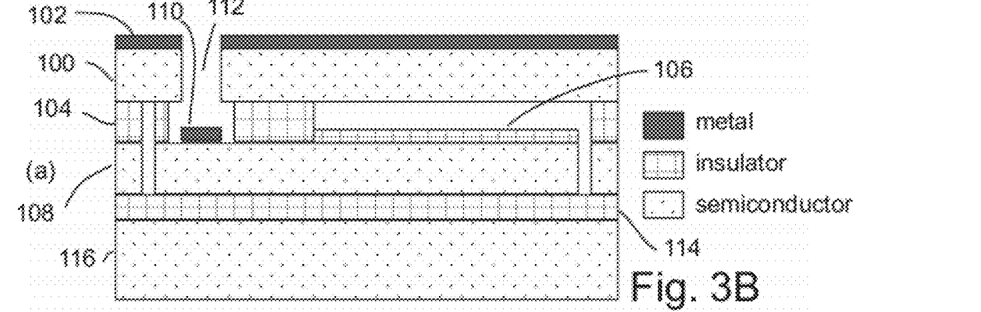
FIG. 3B depicts a cross-section where lower electrode layer is contiguous between bond pad and CMUT cavity.
Figure 3C:
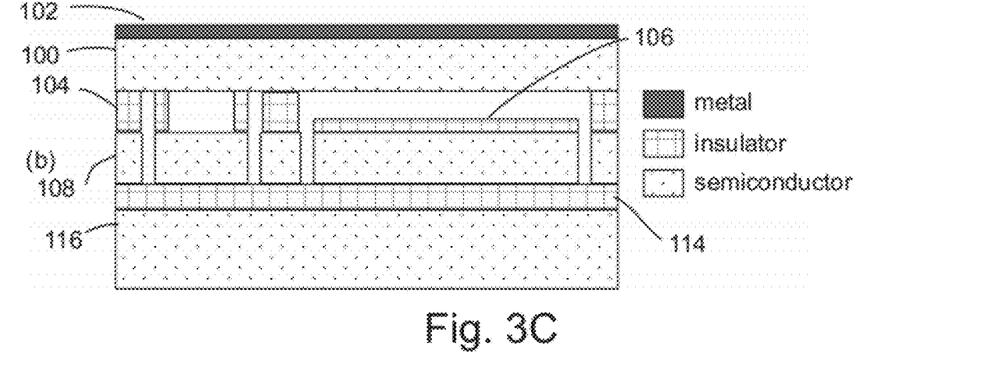
FIG. 3C depicts a cross-section where electrical isolation trenches are used to define bond pad, wire, and lower CMUT element within the lower electrode Si layer.

Referring to FIGS. 3A-3C, FIG. 3A shows a plan view of a representative CMUT device wherein the dashed lines depict the section lines cut along to produce views 3B and 3C. FIG. 3B depicts a cross-section where lower electrode layer is contiguous between bond pad and CMUT cavity. FIG. 3C depicts a cross-section where electrical isolation trenches are used to define bond pad, wire, and lower CMUT element within the lower electrode Si layer.

The CMUT structure includes:

a membrane/upper electrode Si layer 100 (either selectively (one extra mask step) or completely metalized for ground electrode contact, forming metal layer 102);

a bonding oxide 104 as the bonding surface, bond performed immediately after oxide growth (or subsequent to barrier oxide 106 growth thus not requiring cleaning prior to bonding);

a barrier oxide 106 contiguous with bonding oxide 104;

a lower electrode Si layer 108 (selectively metalized forming metal portions 110 at bond pad openings 112);

an electrical isolation 114 buried (BOX) below the lower electrode Si layer (isolates from the handle wafer); and, a Si handle layer 116 below electrical isolation BOX.

The barrier oxide 106 and the bonding oxide 104 may be different materials or the same material.

The bonding oxide is grown or deposited to a specific thickness in order to specify the gap between the upper electrode membrane and the lower electrode (accounting for the thickness of the barrier oxide). The gap thickness determines the mechanical deformation and voltage requirements for pull down of the membrane, for a given combination of membrane width and thickness.

The bonding oxide and barrier oxides must be grown using a double oxidation process, wherein, the growth rate of the bonding oxide during the barrier oxide growth step is accounted for. This ensures that the final desired gap is achieved while also growing the barrier oxide to a thickness sufficient to prevent electrical breakdown. In the preferred embodiment of the fabrication method, the bonding oxide is thermally grown on the patterned lower electrode layer, then selectively removed in the barrier oxide regions, prior to the barrier oxide being re-grown (again thermally). In this manner, it is possible to form both the bonding and barrier oxides from one contiguous oxide layer, improving the quality of the hermetic seal, the bonding quality and the reliability of the device.

The upper electrode 100 is the common electrode, which also serves as the mechanical membrane which provides the ultrasonic signal when thus stimulated, and changes capacitance when receiving a signal, acting as a microphone. Thus, the design can be used in both sending and receiving modes. It should also be noted that by using the upper silicon electrode as the common electrode, the device ensures that the surface interacting with a patient or living tissues in medical applications is not energized, providing a significant safety enhancement over many other proposed CMUT devices.

The top surface electrical contacts 110 to lower electrode Si layer 108 accessed through holes 112 in membrane layer, defined after wafer bonding the upper Si layer to the bonding oxide.

Contacts to lower electrode Si layer are accessible to outside world, but remainder of device is hermetically sealed from these ports using bond between membrane Si layer and gap-defining oxide This design can also be used to form a dual-membrane structure, wherein the handle layer and buried insulator of the original substrate are removed from the backside of the device in the cavity region, thus forming thin membranes in both the upper semiconductor layer and the lower semiconductor layer, and enabling both upper and lower electrodes to act as active mechanical elements in the device. In doing so a more sensitive CMUT device can be created for use in emerging applications.

Figures 1A, 1B, 1C, 1D:
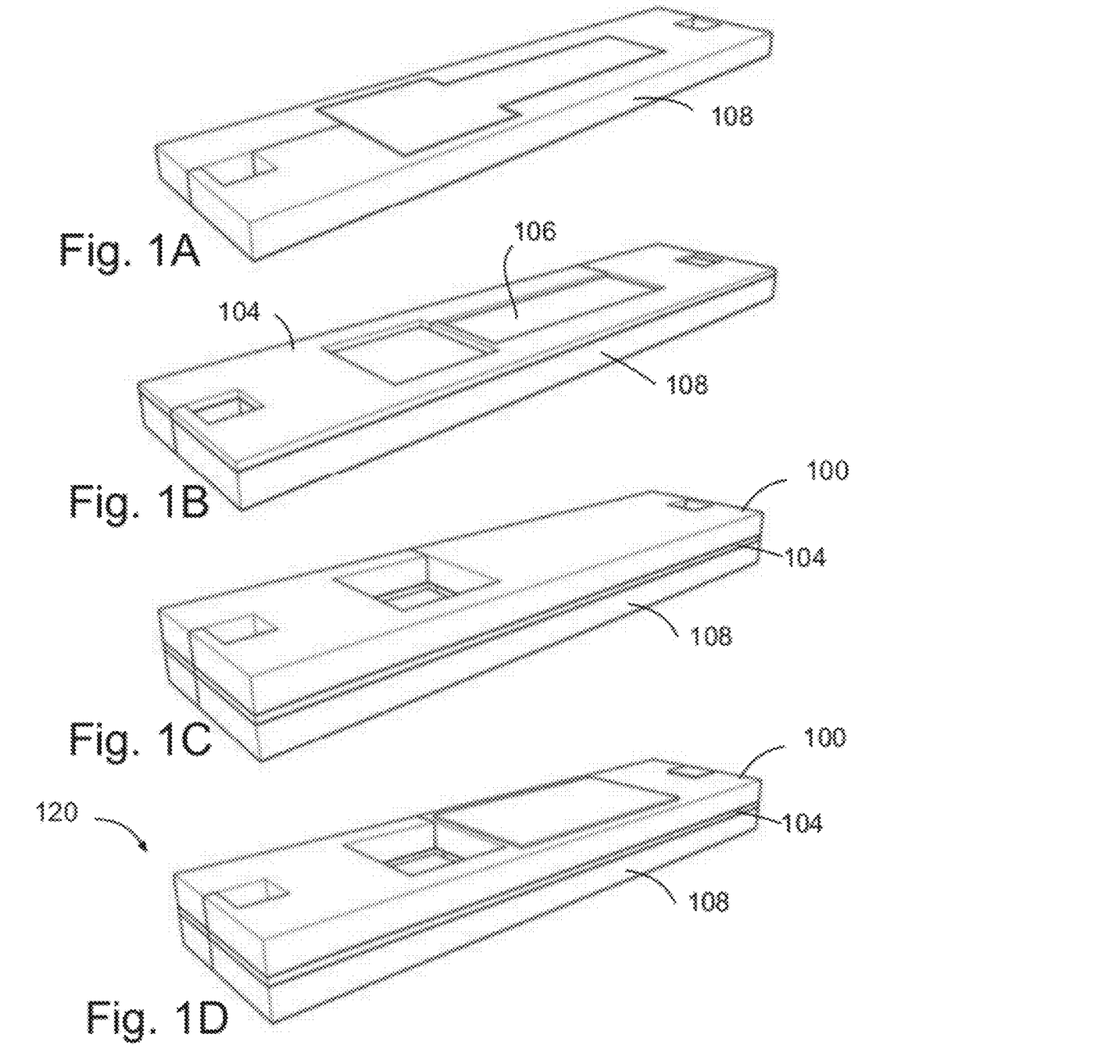
FIGS. 1A-1D: Perspective views of CMUT device. Each subsequent view 1A-1D shows additional layers grown/bonded/patterned.
Figure 2A:
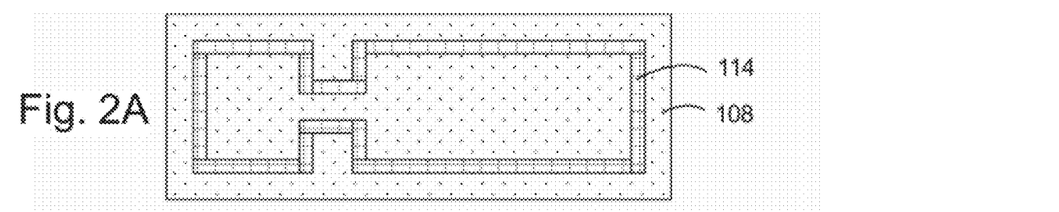
FIGS. 2A-2D: Plan views of CMUT device. Each subsequent view 2A-2D shows additional layers grown/bonded/patterned.
Figure 2B:
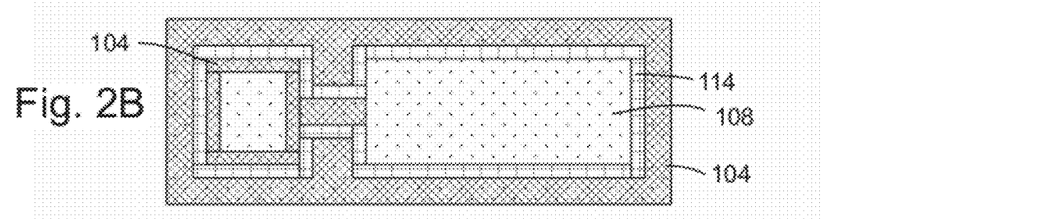
Figure 2C:
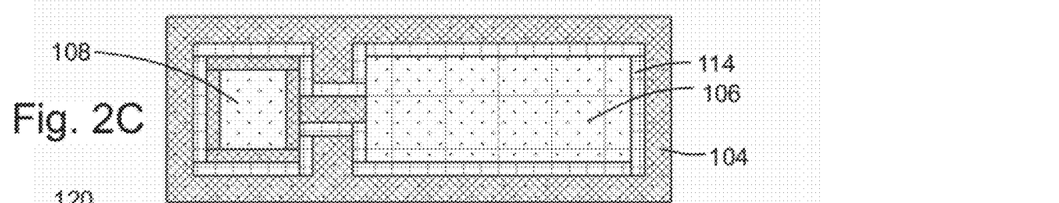
Figure 2D:
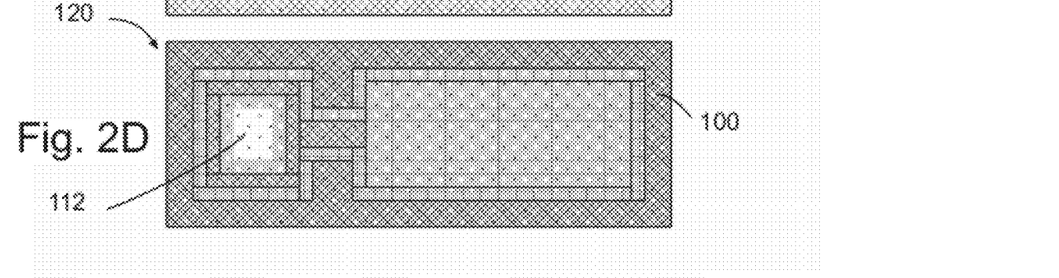
Figure 6A:
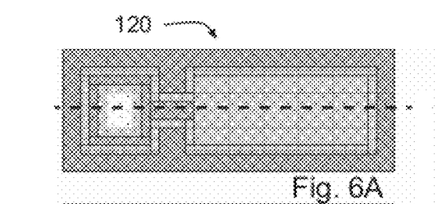
FIGS. 6A and 6B show respective plan views of a CMUT device with dashed lines showing section lines cut along to produce section views. Images 6C-6R are section views, with 6C, 6E, 6G, 6I, 6K, 6M, 6O and 6Q corresponding to the section line shown in 6A and form a sequence showing the process to form a CMUT device wherein bonding insulator is formed prior to formation of electrical isolation trenches, and 6D, 6F, 6H, 6J, 6L, 6N, 6P and 6R correspond to the section line shown in 6B and form a sequence, corresponding to the sequence of 6C to 6Q, and showing the same process.
Figure 6B:
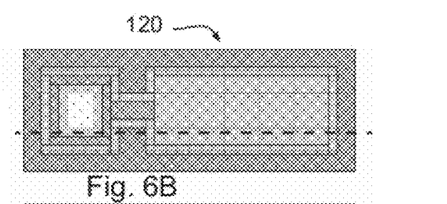
Figure 6C:
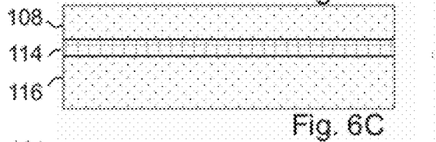
Figure 6D:
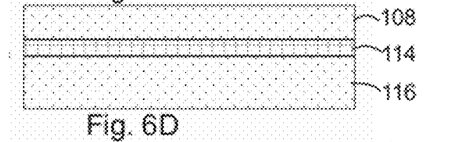
Figure 6E:
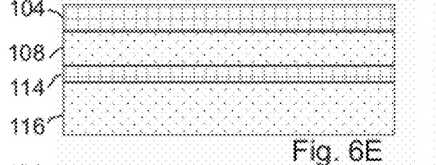
Figure 6F:
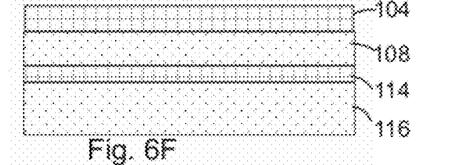
Figure 6G:
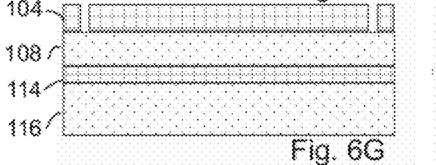
Figure 6H:
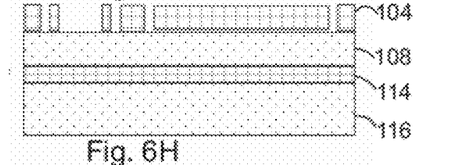
Figure 6I:
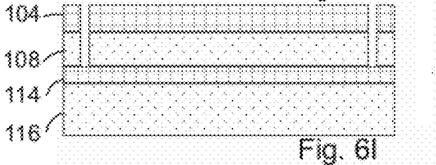
Figure 6J:
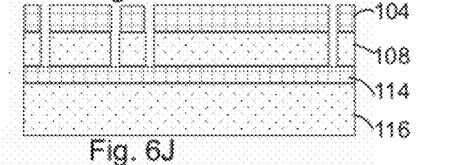
Figure 6K:
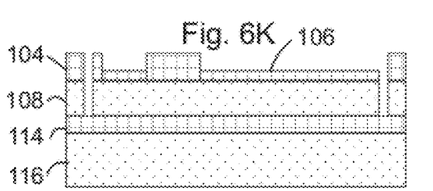
Figure 6L:
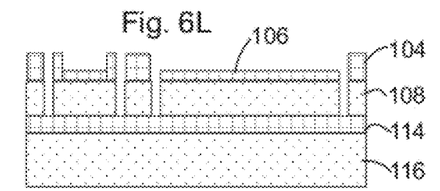
Figure 6M:
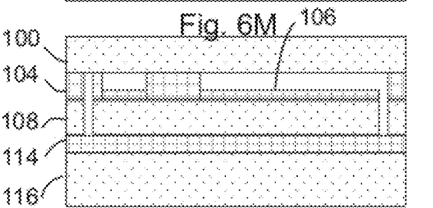
Figure 6N:
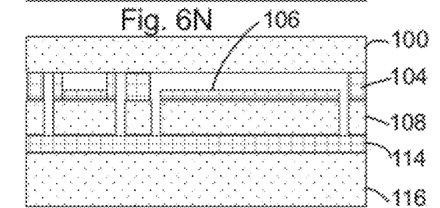
Figure 6O:
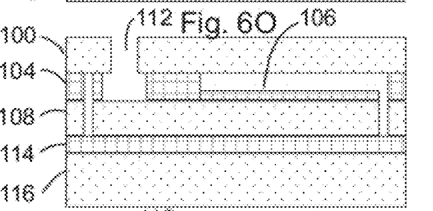
Figure 6P:
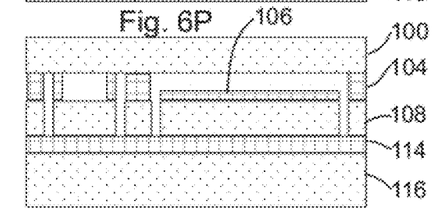
Figure 6Q:
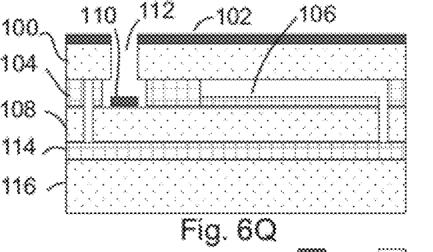
Figure 6R:
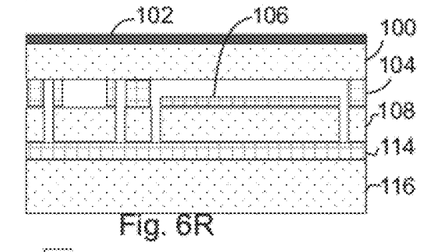
Figure 7A:
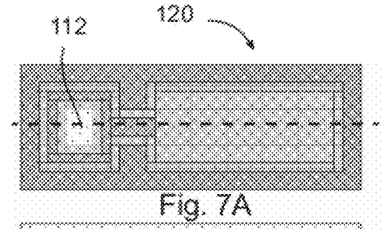
FIGS. 7A and 7B show respective plan views of a CMUT device with dashed lines showing section lines cut along to produce section views.
Figure 7B:
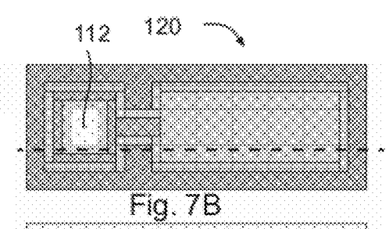
Figure 7C:
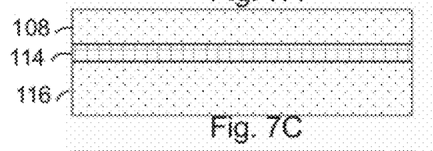
FIGS. 7C-7J are section views, with FIGS. 7C, 7E, 7G and 7I corresponding to the section line shown in FIG. 7A and forming a sequence showing the process to form a CMUT device wherein bonding oxide is formed after electrical isolation trenches are etched.
Figure 7D:
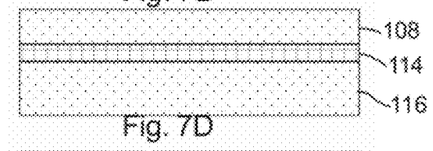
Figure 7E:
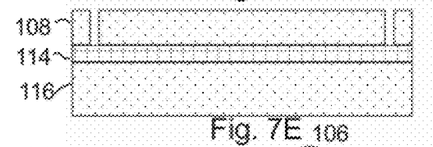
Figure 7F:
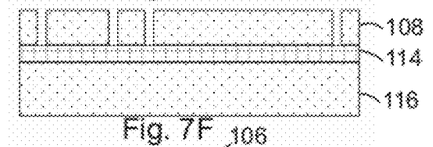
Figure 7G:
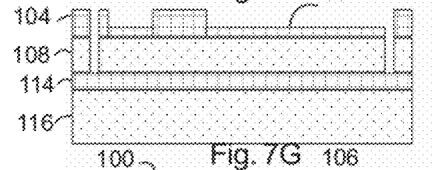
Figure 7H:
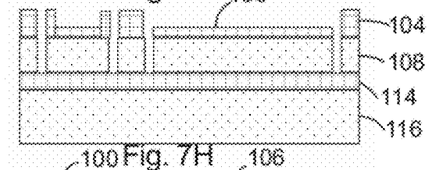
Figure 7I:
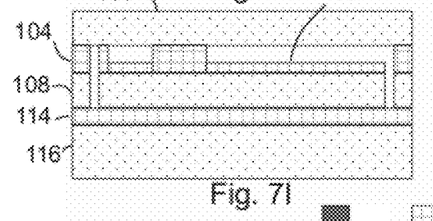
Figure 7J:
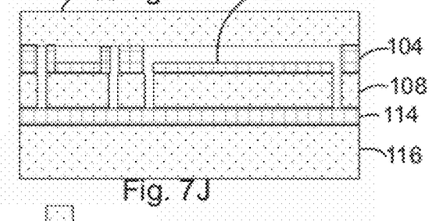

One method of fabrication for this device comprises: (1) oxidizing an SOI wafer 108, 114, 116 as shown in FIGS. 6E and 6F to form an oxide 104; (2) lithographically patterning the oxide 104 to define CMUTs (FIGS. 6G and 6H); (3) vertically etching (with deep reactive ion ething, DRIE, for example) Si to electrical isolation CMUTs from each other (FIGS. 6I and 6J); (4) patterning the oxide 104 to define oxide stand-offs and to selectively remove oxide from the cavity regions (FIGS. 6K and 6L); (5) oxidizing to grow a barrier oxide 106 in the cavity regions and achieve final bonding oxide height (FIGS. 6K and 6L); (6) fusion bonding Si wafer 100 to bonding oxide (FIGS. 6M and 6N); (7) grinding and polishing to set thickness of upper Si layer (FIGS. 6M and 6N); (8) etching bond pad opening 112 in the upper Si layer 100 and subsequently the exposed oxide on lower Si layer (FIGS. 6O and 6P); and (9) depositing metal (any suitable metal) to form electrical connections 110 to the lower electrode layer 108(which is biased) and upper electrode layer 100 (which is the common electrode) (FIGS. 6Q and 6R). Referring to FIGS. 7A-7J FIGS. 7A and 7B show respective plan views of a CMUT device with dashed lines showing section lines cut along to produce section views. FIGS. 7C-7J are section views, with FIGS. 7C, 7E, 7G and 7I corresponding to the section line shown in FIG. 7A and forming a sequence showing the process to form a CMUT device wherein bonding oxide is formed after electrical isolation trenches are etched. FIGS. 7D, 7F, 7H and 7J correspond to the section line shown in FIG. 7b and form a sequence, corresponding to the sequence of FIGS. 7C-7I, showing the same process. This process is similar to the process shown in FIGS. 6A-6R as described above except that step (3) of the process above occurs before steps (1) and (2). FIGS. 7C and 7D show the initial SOI wafer. FIGS. 7E and 7F show the result of applying step (3) to the wafer of FIGS. 7C and 7D. FIGS. 7G and 7H show the result of applying steps (1),(2), (4) and (5) to the wafer of FIGS. 7E and 7F. FIGS. 7I and 7H show the result of applying steps (6) and (7) to the wafer of FIGS. 7G and 7H. As can be seen, FIGS. 7I and 7J appear the same as FIGS. 6M and 6N, and steps (8) and (9) can be applied as shown in FIGS. 6O-6R. FIGS. 2A-2D show a similar process as FIGS. 7A-7J with a sequence of plan views. FIG. 2A shows the SOI wafer after step (3). FIG. 2B shows the wafer of FIG. 2A after the application of steps (1), (2) and (4). FIG. 2C shows the wafer of FIG. 2B after the application of step (5). FIG. 2D shows the wafer of FIG. 2C after the application of steps (6), (7) and (8).

Figure 8A:
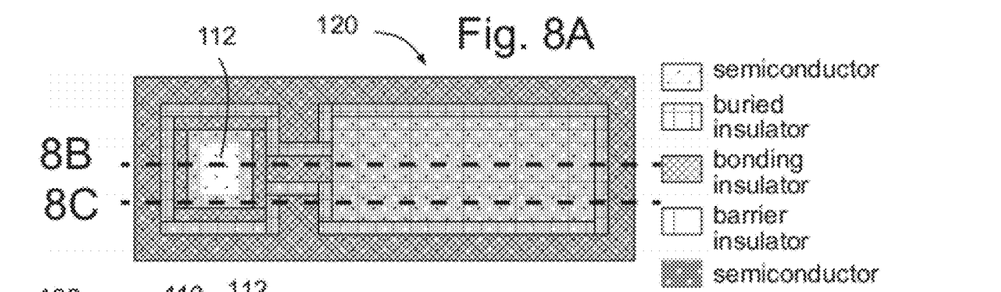
FIG. 8A shows a plan view of a CMUT device with the barrier insulator deposited or grown on the upper semiconductor electrode surface wherein the dashed lines depict the section lines cut along to produce views 8B and 8C.
Figure 8B:
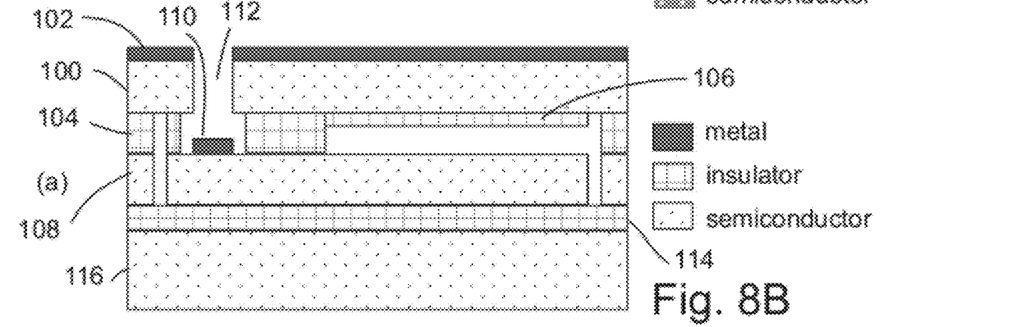
FIG. 8B depicts a cross-section where lower electrode layer is contiguous between bond pad and CMUT cavity.
Figure 8C:
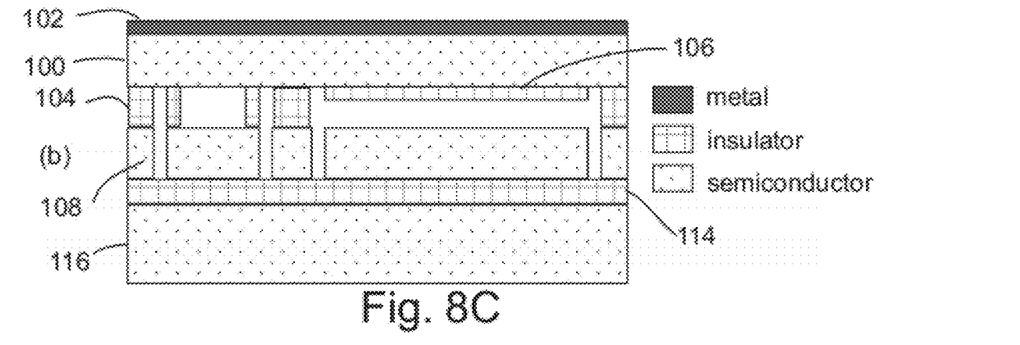
FIG. 8C depicts a cross-section where electrical isolation trenches are used to define bond pad, wire, and lower CMUT element within the lower electrode Si layer.

Variations, which may be preferable, on the process flow include, but are not limited to:

bonding an SOI wafer in step 6, to ensure that the upper silicon layer would have a tighter thickness tolerance—when using an SOI at this stage, the handle layer would then have to be ground and polished to remove it, followed by an oxide etch to remove the buried oxide, before proceeding with step 8;

adding an additional patterning step as step 10 to limit the area of the upper Si layer coated with metal;

adding an additional backside etch step as step 11 to create a "naked CMUT";

skipping steps 1 and 2; grow bonding oxide in step 4; and growing the barrier oxide on upper SOI prior to bonding (step 6). FIG. 8A shows a plan view of a CMUT device with the barrier insulator deposited or grown on the upper semiconductor electrode surface wherein the dashed lines depict the section lines cut along to produce views 8B and 8C. FIG. 8B depicts a cross-section where lower electrode layer is contiguous between bond pad and CMUT cavity. FIG. 8C depicts a cross-section where electrical isolation trenches are used to define bond pad, wire, and lower CMUT element within the lower electrode Si layer.

One of the most critical elements of the invention is the method of forming buried electrode by using bonding oxide to form a hermetic seal around the bond pad where the lower electrode Si layer is exposed is a novel means of electrically addressing hermetically-sealed MEMS devices. This allows for the formation of a cavity with a controllable internal pressure, including the ability for the cavity to contain a vacuum. In doing so, this enable a significant performance enhancement for this design of CMUT over many other simple CMUT technologies while also requiring less complex processing.

Variations on the method include:

Treatment of the silicon surface of the electrode prior to the second oxide growth to roughen it to prevent welding, thus not requiring any additional mask steps to protect the bonding surface. This step is carried out by adding a step by using the mask already in place in FIGS. 6E and 6F to roughen the exposed silicon surface prior to further dielectric growth, in order to increase surface area and roughness to reduce electrode affinity in operation. Referring to FIGS. 6A-6R, FIGS. 6A and 6B show respective plan views of a CMUT device with dashed lines showing section lines cut along to produce section views. Images 6C-6R are section views, with 6C, 6E, 6G, 6I, 6K, 6M, 6O and 6Q corresponding to the section line shown in 6A and form a sequence showing the process to form a CMUT device wherein bonding insulator is formed prior to formation of electrical isolation trenches, and 6D, 6F, 6H, 6J, 6L, 6N, 6P and 6R correspond to the section line shown in 6B and form a sequence, corresponding to the sequence of 6C to 6Q, and showing the same process .

Use of an additional mask after the standoff oxide growth to allow either a roughening step or a growth of a high impedance material to allow charge dissipation. This step is carried out by use of an additional masking layer to expose only the lower dielectric layer to allow coating or roughening to modify the lower oxide surfaces in FIGS. 6K and 6L in order to reduce surface affinity in operation.

Figure 9A:
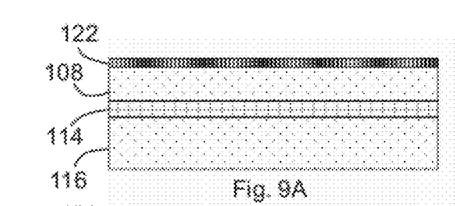
FIGS. 9A-9N show a series of fabrication steps of a CMUT where silicon nitride is used instead of an oxide layer on the SOI wafer.
Figure 9B:
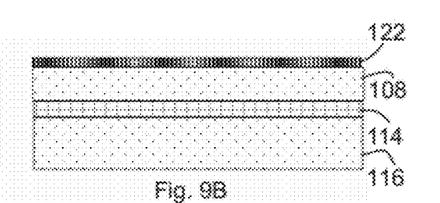
Figure 9C:
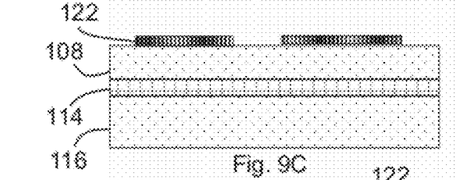
Figure 9D:
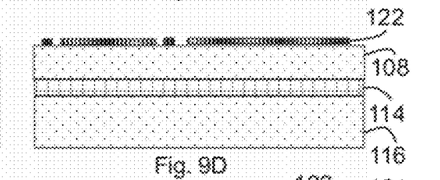
Figure 9E:
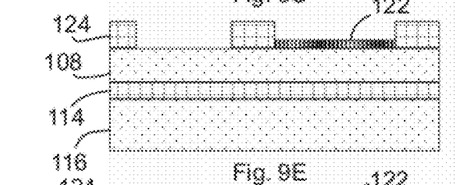
Figure 9F:
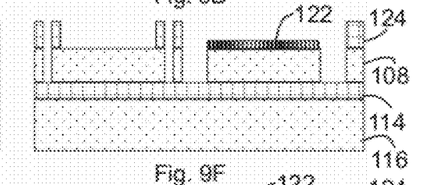
Figure 9G:
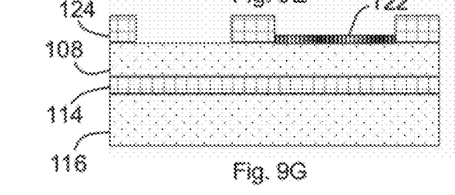
Figure 9H:
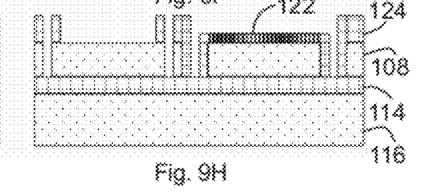
Figure 9I:
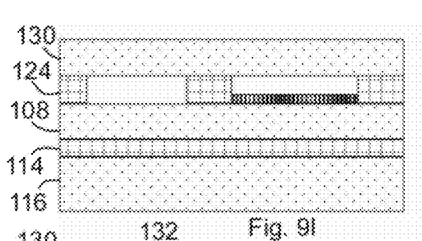
Figure 9J:
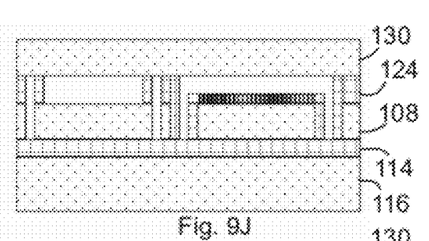
Figure 9K:
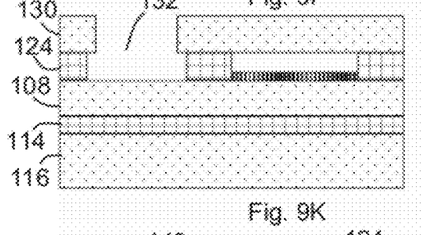
Figure 9L:
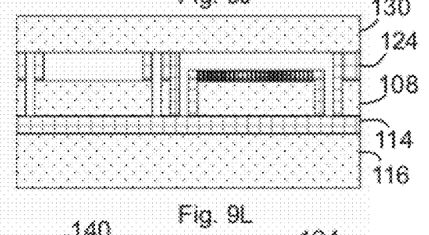
Figure 9M:
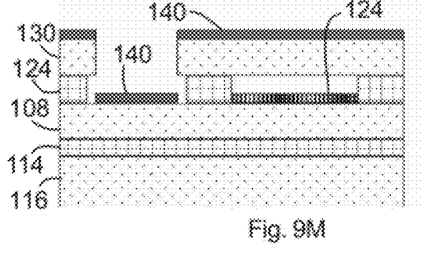
Figure 9N:
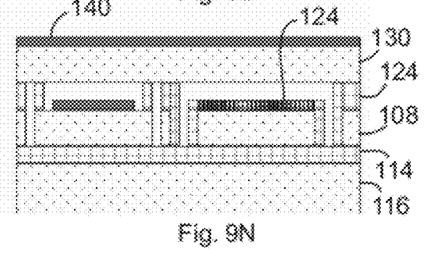

Referring to FIGS. 9A-9N, using silicon nitride 122 as the first deposition on the bottom SOI (formed here of silicon 108 and 116 and oxide 114), then isolating the electrodes using the silicon nitride as a hard mask, and patterning the nitride in a second etch to use it as a dielectric for the electrode area. The subsequent growth of the thermal oxide will act similarly to LOCOS growth in the semiconductor industry, and offer the same pristine and well controlled bonding and gap forming structure, without changing the number of mask and deposition steps. In LOCOS, LOCal Oxidation of Silicon, silicon dioxide is formed in selected areas on a silicon wafer by thermal oxidation of selected regions. The oxygen penetrates in depth of the wafer, reacts with silicon and transforms it in to silicon oxide. This alternative is carried out by first growing the cavity dielectric of another material than is used for the bonding layer, such as silicon nitride, so that the lower dielectric surfaces in FIGS. 6K and 6L are made of the silicon nitride, allowing growth of the thicker (upper) dielectric bonding layer can be still made of silicon dioxide. This would require replacement of oxide growth in step 1 with silicon nitride. In this case, the lower dielectric is silicon nitride, formed first, and the bonding layer made of oxide is formed afterwards.

FIGS. 9A, 9C, 9E, 9G, 9I, 9K and 9M correspond to a cut through a CMUT as shown in FIG. 6A but made with the silicon nitride rather than oxide, and FIGS. 9B, (D, 9F, 9H, 9J, 9L and 9N correspond to a cut through such a CMUT as shown in FIG. 6B but made with silicon nitride instead of the first oxide. Thus, steps are shown of depositing silicon nitride or other suitable material on the upper silicon 108 by any suitable means (FIGS. 9A and 9B), lithographically patterning the nitride 122 to define CMUTs (FIGS. 9C and 9D); (3) growing an oxide layer 124 on the silicon 108 using the silicon nitride 122 as a mask and vertically etching the silicon (with DRIE for example) to electrically isolate CMUTs from each other (FIGS. 9E and 9F); (4) oxidizing to grow a barrier oxide in the cavity regions and achieve final bonding oxide height (FIGS. 9G and 9H, although the oxide is only shown as covering a portion of the exposed surfaces on the right side of FIG. 9H: the oxide will cover all exposed surfaces and can be removed where required in a subsequent step such as in FIG. 9K); (5) bonding Si wafer 130 to bonding oxide (FIGS. 9I and 9J) for example by fusion and grinding and polishing to set thickness of upper Si layer; (6) etching bond pad opening 132 in the upper Si layer 130 and subsequently the exposed nitride on lower Si layer 108 (FIGS. 9K and 9L); and (7) depositing metal (any suitable metal) to form electrical connections 140 to the lower electrode layer 108(which is biased) and upper electrode layer 130 (which is the common electrode) (FIGS. 9M and 9N).

The dielectrics mentioned here may be for example silicon oxide(s), silicon nitride, silicon oxynitride or silicon carbide or any other suitable dielectric. Different dielecrtric layers may be made of different dielectrics, or combinations of dielectrics.

Applications: The device may be used in areas presently being addressed with piezoelectric based ultrasonic transducers. The device may be produced in arrays. FIG. 4 shows a 1D linear array of CMUT cells. FIG. 5 shows a representative 2D array of CMUT cells. It is understood that by routing the lower Si wires connecting the bond pads to the lower CMUT electrode appropriately, larger m x n arrays of CMUT cells can be formed. Imaging, diagnostic medical and for NDT (Non Destructive Testing) are the most likely areas of first adoption, given the ability to make an array of devices, which is much more challenging to do with piezoelectric devices. Though the power output is not presently as high as piezoelectric devices can offer, therapeutic and other applications which require local application of ultrasonic waves at close proximity are possible areas of use. Given the ability to make a custom shaped array, a number of applications involving sending and detecting ultrasonic signals are envisioned.

Immaterial modifications may be made to the embodiments described here without departing from what is covered by the claims. In the claims, the word "comprising" is used in its inclusive sense and does not exclude other elements being present. The indefinite article "a" before a claim feature does not exclude more than one of the feature being present. Each one of the individual features described here may be used in one or more embodiments and is not, by virtue only of being described here, to be construed as essential to all embodiments as defined by the claims.

The embodiments of the invention in which an exclusive property or privilege is claimed are defined as follows:

1. A capacitive micromachined ultrasonic transducer (CMUT) device, comprising:
    a wafer having at least a first semi-conductor electrode layer on an insulating dielectric;
    the first semi-conductor electrode layer forming a CMUT pattern with dielectric stand-offs on the first semi-conductor electrode layer, the dielectric stand-offs being continuous in at least selected portions of the CMUT pattern to define sealed CMUT cavities;
    a second semi-conductor electrode layer bonded onto the dielectric stand-offs with a gap between the first semi-conductor electrode layer and the second semi-conductor electrode layer creating the sealed CMUT cavities, the second semi-condutor electrode layer comprising a mechanical membrane responsive to an electrical stimulus to generate an ultrasonic signal and responsive to sound waves to change capacitance;
    the dielectric stand-offs having a height sufficient to provide electrical isolation between the first semi-conductor electrode layer and the second semi-conductor electrode layer; and
    for each CMUT in the CMUT pattern, respective contacts on the first semi-conductor electrode layer and the second semi-conductor electrode layer.

2. The CMUT of claim 1 in which the respective contacts comprise metalized portions of the respective first semi-conductor electrode layer and the second semi-conductor electrode layer.

3. The CMUT of claim 2 in which a portion of the second semi-conductor electrode layer is removed to provide access to the respective contact on the first semi-conductor electrode layer.

4. The CMUT of claim 2 in which the wafer comprises a handle layer having a porton removed.

5. The CMUT of claim 1 further comprising a barrier dielectric on the CMUT pattern of the wafer.

6. The CMUT of claim 1 in which the semi-conductor comprises silicon or silicon carbide.

7. The CMUT of claim 1 in which the dielectric comprises one or more oxides, nitrides or oxynitrides.

8. The CMUT of claim 1 in which the dielectric is one or more of a silicon oxide, a silicon nitride and a silicon oxynitride.

9. The CMUT of claim 1 in which the second semi-conductor electrode layer comprises a common electrode.

10. The CMUT of claim 1 in which the first semi-conductor electrode layer comprises a second mechanical membrane.

* * * * *